(12) United States Patent
Wu et al.

(10) Patent No.: US 6,884,736 B2
(45) Date of Patent: Apr. 26, 2005

(54) METHOD OF FORMING CONTACT PLUG ON SILICIDE STRUCTURE

(75) Inventors: Chii-Ming Wu, Taipei (TW); Mei-Yun Wang, Hsin-Chu (TW); Chih-Wei Chang, Hsin-Chu (TW); Chin-Hwa Hsieh, Hsinchu (TW); Shau-Lin Shue, Hsinchu (TW); Chu-Yun Fu, Taipei (TW); Ju-Wang Hsu, Taipei (TW); Ming-Huan Tsai, Hsinchu (TW); Yuan-Hung Chiu, Taipei (TW)

(73) Assignee: Taiwan Semiconductor Manufacturing Co, Ltd., Hsin-Chu (TW)

( * ) Notice: Subject to any disclaimer, the term of this patent is extended or adjusted under 35 U.S.C. 154(b) by 0 days.

(21) Appl. No.: 10/265,937

(22) Filed: Oct. 7, 2002

(65) Prior Publication Data

US 2004/0067635 A1 Apr. 8, 2004

(51) Int. Cl.$^7$ .............................................. H01L 21/302
(52) U.S. Cl. ...................... 438/740; 438/637; 438/649; 438/723; 438/724; 438/734; 438/700; 438/702; 438/586
(58) Field of Search ................................ 438/586, 622, 438/637, 623, 624, 634, 649, 723, 724, 734, 700, 702, 703, 710, 738, 740

(56) References Cited

U.S. PATENT DOCUMENTS

| | | | |
|---|---|---|---|
| 5,645,887 A | 7/1997 | Byun | 427/248.1 |
| 5,739,563 A | 4/1998 | Kawakubo et al. | 257/295 |
| 6,008,124 A | 12/1999 | Sekiguchi et al. | 438/653 |
| 6,143,617 A | 11/2000 | Shue et al. | 438/396 |
| 6,201,303 B1 * | 3/2001 | Ngo et al. | 257/768 |
| 6,225,216 B1 * | 5/2001 | Ngo et al. | 438/637 |
| 6,228,761 B1 * | 5/2001 | Ngo et al. | 438/637 |
| 6,232,224 B1 | 5/2001 | Inoue | 438/639 |
| 6,236,091 B1 * | 5/2001 | Ngo et al. | 257/383 |
| 6,249,010 B1 | 6/2001 | Bergemont | 257/50 |
| 6,284,664 B1 | 9/2001 | Kawai | 438/710 |
| 6,320,213 B1 | 11/2001 | Kirlin et al. | 257/295 |
| 6,326,270 B1 | 12/2001 | Lee et al. | 438/279 |
| 6,350,636 B1 | 2/2002 | Lee et al. | 438/186 |
| 6,351,016 B1 | 2/2002 | Huang et al. | 257/382 |
| 6,362,023 B1 | 3/2002 | Bergemont et al. | 438/131 |
| 6,362,086 B1 | 3/2002 | Weimer et al. | 438/591 |
| 6,380,014 B1 * | 4/2002 | Ohta et al. | 438/197 |
| 6,380,578 B1 | 4/2002 | Kunikiyo | 257/301 |
| 6,576,548 B1 * | 6/2003 | Tu et al. | 438/640 |
| 6,602,434 B1 * | 8/2003 | Hung et al. | 216/39 |
| 2002/0081794 A1 * | 6/2002 | Ito | 438/200 |

* cited by examiner

Primary Examiner—M. Wilczewski
(74) Attorney, Agent, or Firm—Duane Morris LLP

(57) ABSTRACT

A method of manufacturing a semiconductor device is provided. A semiconductor element is formed on a substrate. The semiconductor element has at least one nickel silicide contact region, an etch stop layer formed over said element, and an insulating layer formed over said etch stop layer. A portion of the etch stop layer immediately over a selected contact region is removed using a process that does not substantially react with the contact region, to form a contact opening. The contact opening is then filled with a conductive material to form a contact.

43 Claims, 7 Drawing Sheets

METHOD OF FORMING CONTACT PLUG ON SILICIDE STRUCTURE

FIELD OF INVENTION

The present invention relates to methods of fabricating integrated circuits, and more particularly to methods of forming contact plugs in integrated circuit structures.

BACKGROUND OF THE INVENTION

A prior art method of forming a contact plug to a gate, source or drain region of a MOS device is provided in connection with FIGS. 1–1B. A MOS device structure is shown in FIG. 1. Methods for fabricating the structure of FIG. 1 are well known in the art of integrated circuit fabrication, as described in, for example, U.S. Pat. No. 6,232,224 to Inoue and U.S. Pat. No. 6,350,636 to Lee et al., the entirety of which are hereby incorporated by reference herein. The MOS device of FIG. 1 is fabricated on a substrate 2, such as a silicon substrate, and is isolated from other devices by shallow trench isolation (STI) 4. A gate dielectric 6, such as an oxide, is formed on the substrate 2 along with gate electrode 8, often formed from polysilicon. The device also includes lightly doped regions 10 and more heavily doped source/drain regions 12. Spacers 14, usually of silicon oxide, and metal silicide layers 16 are also provided. A layer of silicon nitride 18, which serves as an etch stop layer as described below, is disposed over the MOS device, along with an interlayer dielectric or insulating layer 20.

Referring to FIG. 1A, a photoresist layer 22 is patterned and formed over the interlayer dielectric film 20 to expose a small area of the film 20 over gate 8 or source/drain 12. An etch process is then executed to open contact tunnel 24 through interlayer dielectric film 22 down to the etch stop layer 18 above the selected contact region. This etch stop layer helps protect side wall spacers 14 from being etched. After the contact tunnel 24 is formed, a second etch step is performed to remove the etch stop layer 18 to expose the desired metal silicide contact region 16. A wet etch process is also performed to remove the photoresist 22 and any polymer remaining from the aforementioned etch steps. As shown in FIG. 1B, a contact plug 26 is then deposited to form a contact to the exposed metal silicide region 16. An additional cleaning step may also be performed to smooth the silicide region and remove any native oxide before depositing the contact plug 26.

Metal silicide layers 16 are usually either cobalt, tungsten, or titanium silicides. Tungsten silicide layers are typically used for 0.35 μm processes, titanium silicide is used for 0.25 μm processes, and cobalt silicide is usually selected for 0.13–0.18 μm processes. Nickel silicide contacts have been proposed for newer processes, such as 0.13 μm and smaller processes, in order to provide resistivity reductions and to take advantage of nickel silicide's low leakage or diffusion characteristics. A problem arises, however, when opening contact holes to nickel silicide contact regions using prior art processes. These processes typically use CF based etchants, and it is believed that the $O_2$, F and/or CO components of either or both of the photoresist removal etchant or the etch stop layer removal etchants react with the nickel silicide contact regions, resulting in contact resistivity (Rc) failure— essentially an open circuit. This is generally not a concern when cobalt silicide contact regions are utilized, as described in Inoue, because cobalt silicide is more stable than nickel silicide and does not suffer from the consequent contact Rc failure issue.

Therefore, there is a need for a new method of forming contacts to a device. To that end, there remains a need for a new method of opening contact tunnels to silicide contact regions, such as nickel silicide contact regions, when forming contact plugs to an integrated circuit device.

SUMMARY OF THE INVENTION

A first method of manufacturing a semiconductor device is provided. A semiconductor element is formed on a substrate. The semiconductor element has at least one nickel silicide contact region, an etch stop layer formed over said element, and an insulating layer formed over said etch stop layer. A portion of the etch stop layer immediately over a selected contact region is removed using a process that does not substantially react with the contact region, to form a contact opening. The contact opening is then filled with a conductive material to form a contact.

In an alternative method of manufacturing a semiconductor device, a semiconductor element is formed on a substrate including at least one nickel silicide contact region, a first etch stop layer formed over the element, a second etch stop layer formed over the first etch stop layer, and an insulating layer formed over the second etch stop layer. The first etch stop layer is removed over a selected contact region using a process that does not substantially react with the contact region, to form a contact opening. The contact opening is then filled with a conductive material to form a contact with.

The new method of manufacturing a semiconductor device minimizes reactions between the nickel silicide contact regions during opening of contact holes or tunnels during the formation of contact plugs thereto. The process thereby reduces contact Rc failures and increases the yield of the manufacturing process.

The above and other features of the present invention will be better understood from the following detailed description of the preferred embodiments of the invention that is provided in connection with the accompanying drawings.

BRIEF DESCRIPTION OF DRAWINGS

The accompanying drawings illustrate preferred embodiments of the invention, as well as other information pertinent to the disclosure, in which.

DETAILED DESCRIPTION

Figure 1:
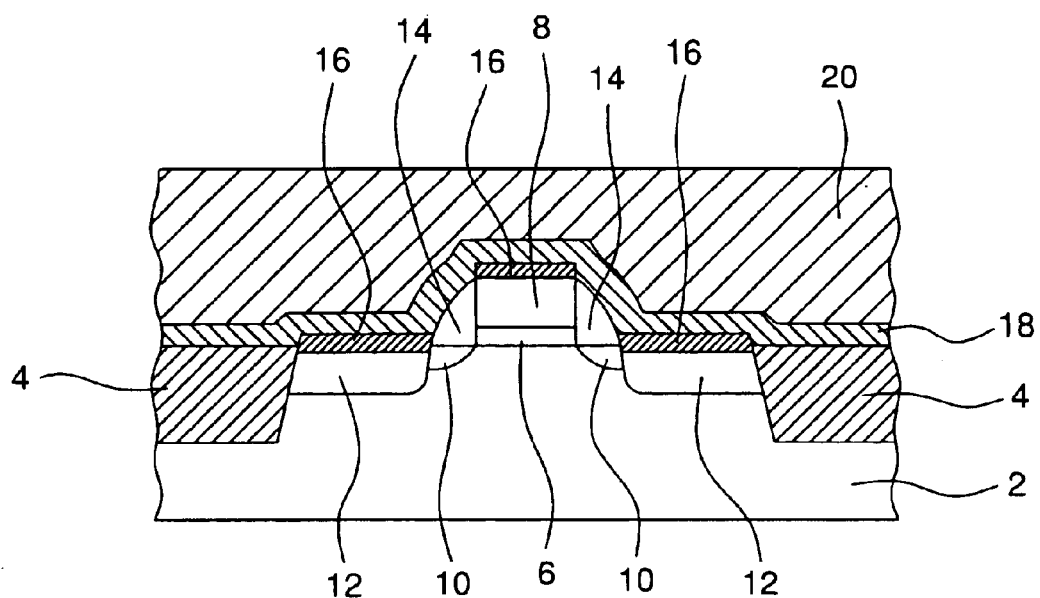
FIGS. 1–1B illustrate a prior art method of forming contacts to a silicide contact region of a MOS device.
Figure 1A:
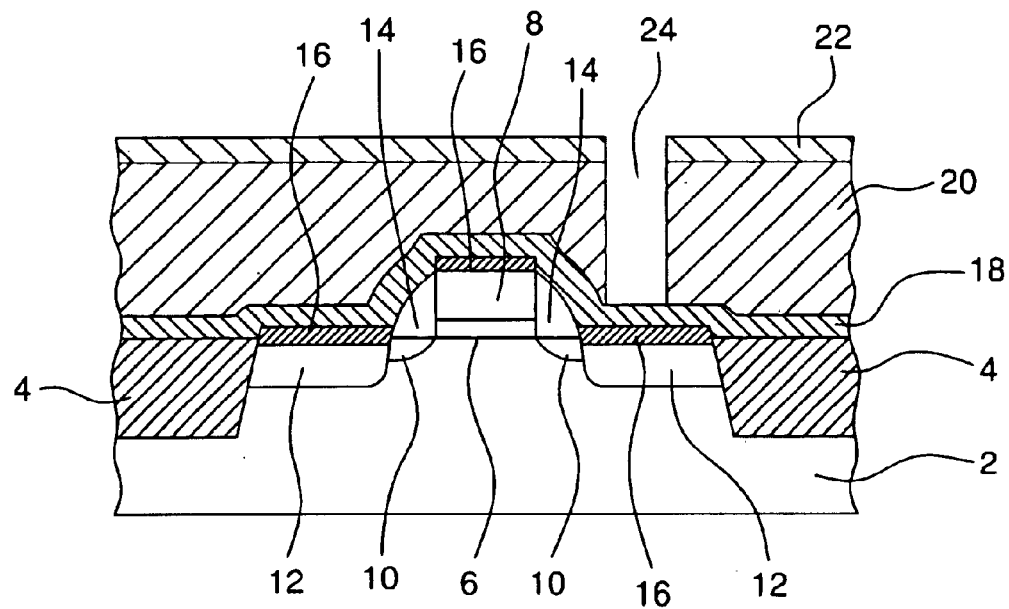
Figure 1B:
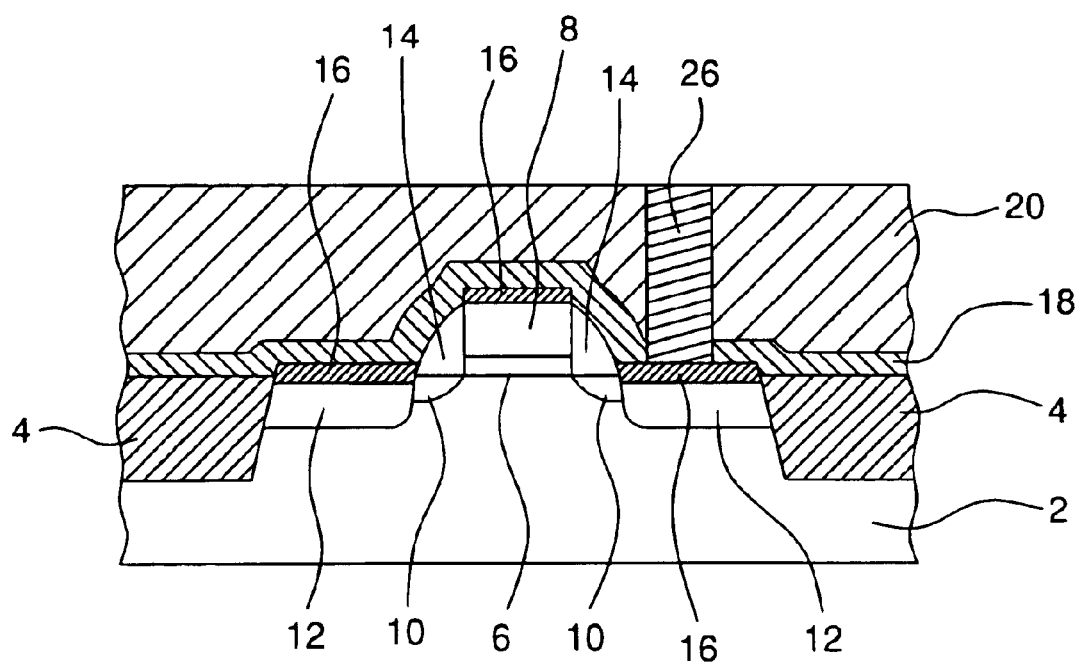

A new method of manufacturing an integrated circuit, including a new method of opening a contact hole to a contact region of a semiconductor device, is described hereafter in connection with FIGS. 2–4D. For ease of illustration, the method is described using enlarged views of contact regions of a semiconductor element without illustrating the complete element structure, and it should be understood that these views are only partial views of a complete structure, such as the MOS transistor device shown and described in connection with FIG. 1, a CMOS device, a capacitor or other semiconductor element.

Figure 2:
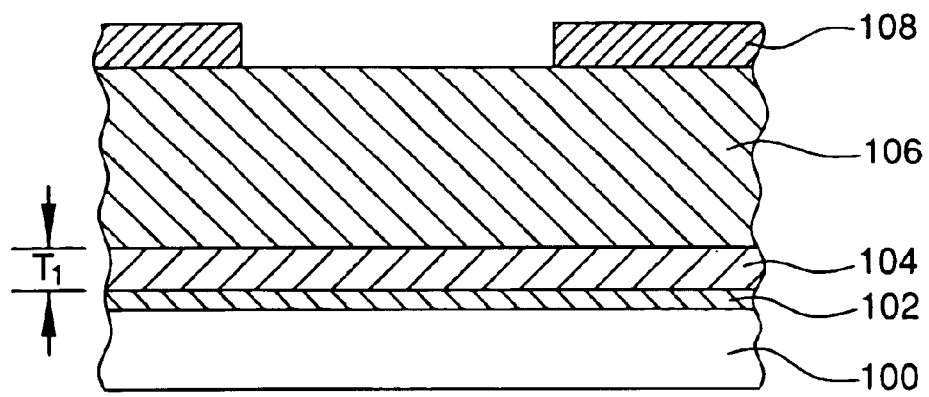
FIGS. 2–2C illustrate a first exemplary method of forming a contact to a silicide contact region.
Figure 2A:
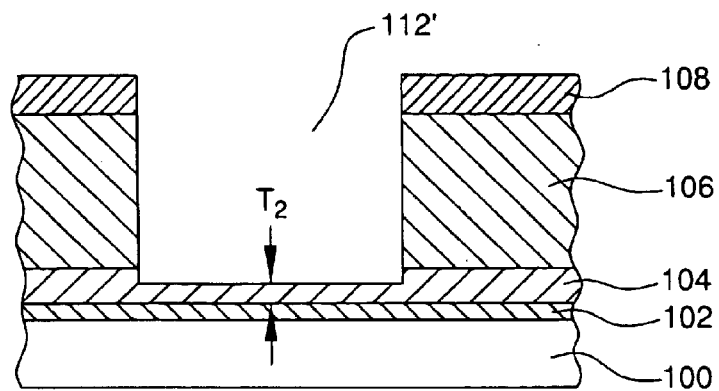
Figure 2B:
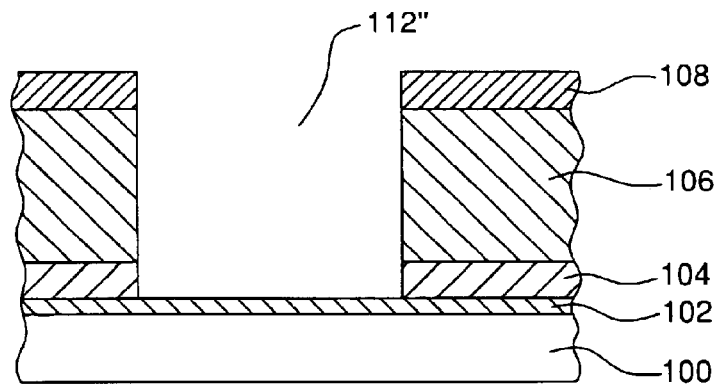
Figure 2C:
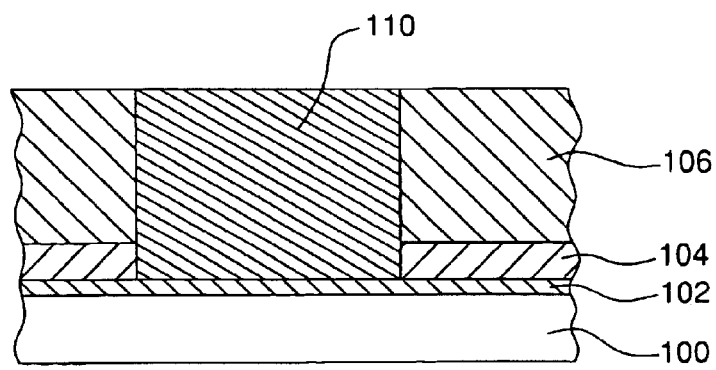

FIGS. 2–2C illustrate a first exemplary method of forming a contact to a metal silicide region, preferably a nickel silicide region. Referring first to FIG. 2, a metal silicide contact region 102 is formed on a semiconductor substrate 100, such as a silicon, germanium or silicon on insulator (SOI) substrate. The metal silicide region 102 typically is formed over a source or drain region or gate electrode. An etch stop layer 104 is formed over the metal silicide region, and an insulating or dielectric layer 106 is formed thereover. A photoresist layer 108 is patterned and formed as shown to expose a region for developing a contact hole or tunnel to the metal silicide region 102.

As mentioned, region 102 includes a metal silicide, such as a tungsten, titanium, or cobalt silicide. More preferably, and for smaller size technologies, e.g., 0.13 µm and below, region 102 includes a nickel silicide layer. The stop layer 104 and dielectric layer 106 should be selected such that the stop layer 104 has a significantly lower etch rate relative to an etchant than the dielectric layer 106, consistent with cost, process robustness and integration concerns familiar to those of ordinary skill. In one embodiment, the dielectric layer 106 is a silicon oxide such as $SiO_2$ and etch stop layer 104 is formed from silicon nitride (SiN) or silicon oxy-nitride (SiON) and has a thickness $T_1$ between approximately 100–500 Å, and more preferably, between approximately 250–300 Å. In another example, a low K material may be selected for dielectric layer 106. In such an embodiment, a $SiO_2$ layer may be used as the stop layer 104.

Referring now to FIG. 2A, a first etch process is employed to open a contact tunnel or hole 112' through dielectric layer 106 to at least the etch stop layer 104, and preferably to at least partially through etch stop layer 104 without exposing metal silicide region 102. The etch process can utilize known etch process techniques for opening up contact holes through the interlayer dielectric 106 and for removing the etch stop layer 104, as described, for example, in the "Background of the Invention" section and U.S. Pat. No. 6,232,224 to Inoue. A two stage etch process is typically employed, with the dielectric layer 106 being removed in a selected region over a selected contact by a first etch process. It is preferable to use an etch method in which an etching rate of the layer 106 is larger than the etching rate of the layer 104. This main etch process is typically accomplished using a CF based dry etch process. Conventionally in the second etch stage, the etch stop layer is then completely etched through using a second etch method, where an etch method is preferably selected such that the etching rate of the layer 104 is greater than that of the dielectric layer 106. This may be accomplished using, for example, a CHF based etch process.

If conventional etch processes are employed, however, the processes can react with a metal-silicide region as described in the "Background of the Invention" section. In the present example, particularly with a nickel-silicide region, the processes are controlled so as to not etch completely through the etch stop layer 104 to expose the metal silicide region 102. It is understood that it can be difficult to control an etch process to exactly stop partially through a layer. Therefore, the etch stop layer 104 preferably has sufficient thickness so as to facilitate only a partial etch through the layer 104. Between approximately 50–200 Å of etch stop layer 104 is preferably consumed, leaving a thickness $T_2$ of etch stop layer remaining as shown in FIG. 2A.

The remaining portion of the etch stop layer 104, or alternatively the entire etch stop layer 104, is then removed using a process that does not substantially react with the metal silicide layer 102. In one exemplary embodiment, the silicide layer 102 includes a nickel silicide and the layer 104, or that remaining part thereof, is physically removed using an argon sputter process, with plasma power between approximately 100–800 Watts (W), bias power between approximately 100–800 W at a pressure of between approximately 0.1–5 mTorr. An argon sputter process is sometimes referred to as "pre-metal clean" and is sometimes employed to remove the native oxide that forms as vacuum breaks when a silicon or silicide surface reacts with the atmosphere after the etch stop layer is removed by an etch process described above in the Background section. However, in the present method, the sputter process is expanded and employed to remove the etch stop layer 104 itself. Other inert gas sputtering processes may also be used, such as a helium sputter process.

Although it is preferable to use a purely physical removal process such as sputtering so that the silicide layer 102 does not react with CF, F, $O_2$ or CO radicals, a dry etch process utilizing an inert gas, such as argon or helium, may alternatively be employed with a dilute etchant solution to minimize reaction with the metal silicide layer 102. For example, an argon or helium gas plasma etch including 0.01–10% $NF_3$ may be used with plasma power between approximately 100–800 W and bias power between 20–500 W is appropriate for removing a SiN or SiON layer 104 over a nickel silicide layer 102. Low concentrations of $NF_3$ reduce reactions with the nickel silicide layer. Alternatively, an argon or helium gas plasma etch including 0.01–10% HF may be employed. It is also contemplated that a hot phosphoric acid removal process maybe employed.

In the manner described above, a contact hole 112" is opened through the dielectric layer 106 and etch stop layer 104 through to the exposed metal silicide layer 102, as shown in FIG. 2B. As shown in FIG. 2C, a conductive material, such as tungsten, is then deposited to fill tunnel 112" to form contact plug 110. This may be accomplished using a conventional process or another deposition technique.

Figure 3:
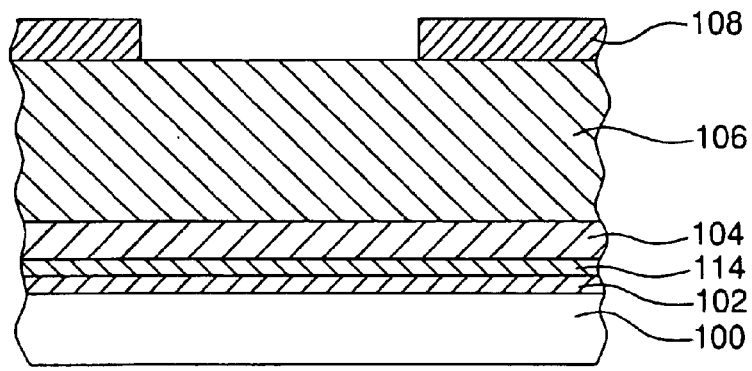
FIGS. 3–3C illustrate another exemplary method of forming a contact to a silicide contact region.
Figure 3A:
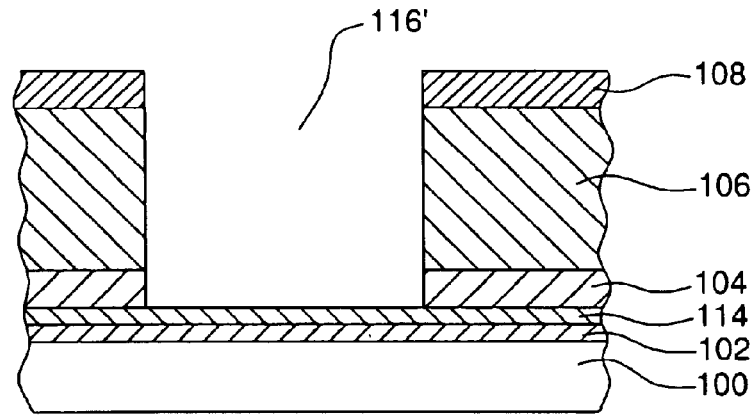
Figure 3B:
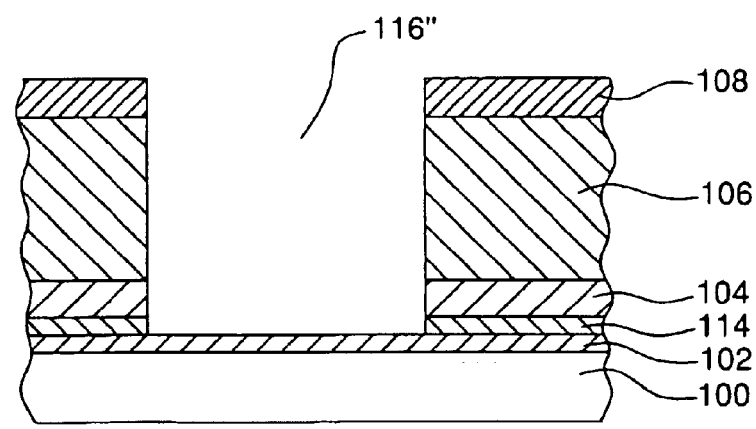
Figure 3C:
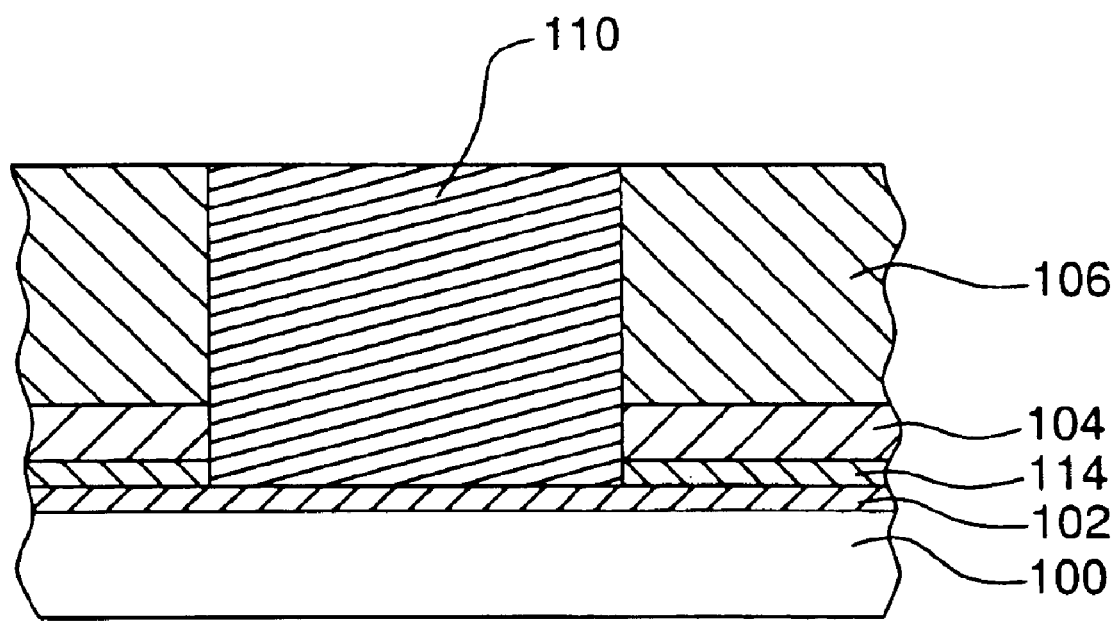

FIGS. 3–3C illustrate an alternative method of forming a contact plug to a metal silicide contact region. Like references are used to indicate like structure shown in FIGS. 2–2C. Referring first to FIG. 3, a semiconductor structure is provided on a substrate 100, including metal silicide layer 102, silicon nitride or silicon oxy-nitride etch stop layer 104, interlayer dielectric 106 and patterned photoresist layer 108. In addition to this structure, which is described above, a relatively thin oxide layer ($SiO_2$) 114 is provided over the metal silicide layer 102 and before formation of etch stop layer 104. This oxide layer 114 preferably has a thickness between approximately 50–100 Å, and may be formed using a chemical vapor deposition (CVD) or $N_2O$ treatment, for example, or using a furnace tube. This oxide layer 114 serves as an additional etch stop layer as described below.

Referring now to FIG. 3A, a tunnel 116' is opened through dielectric layer 106 and etch stop layer 104. These layers 106, 104 may be removed by conventional CF based dry etch process without adversely affecting the metal silicide layer 102, which is protected by oxide layer 114. Regardless of how tunnel 116' is formed, the oxide layer 114 is then removed in the manner described above for etch stop layer 104 using a process that does not substantially react with the metal silicide layer 102, which is preferably a nickel silicide layer.

In one exemplary embodiment, oxide layer 114 is physically removed using an argon sputter process, with plasma power between approximately 100–800 W, bias power between approximately 100–800 W at a pressure between approximately 0.1–5 mTorr. As mentioned above, other inert gas sputtering processes, such as a helium sputter process, may be employed to remove oxide layer 114.

Alternatively, a dry etch process utilizing an inert gas, such as argon or helium, is employed with a dilute etchant solution to minimize reaction with the metal silicide layer 102. For example, an argon or helium gas plasma etch including 0.01–10% $NF_3$ may be used with plasma power between approximately 100–800 W and bias power between 20–500 W. Alternatively, an argon or helium gas plasma etch including 0.1–10% HF may be employed.

In the manner described above, a contact hole 116" is opened through the dielectric layer 106, etch stop layer 104 and oxide stop layer 114 through to the exposed metal silicide layer 102. As is conventional and as shown in FIG. 3C, a conductive material, such as tungsten, is then deposited to fill tunnel 112" to form contact plug 110.

Because, as described above, the etch stop layer 104 or 114, as the case may be, immediately above the metal silicide layer is removed using a process that does not substantially react with the metal silicide layer, the contact resistivity problem described above is addressed and good contact is facilitated between the contact plug 110 and metal silicide regions 102. These results were confirmed (as described below) in tests using the first approach described above in connection with FIGS. 2–2C for nickel silicide contact regions.

Figure 4A:
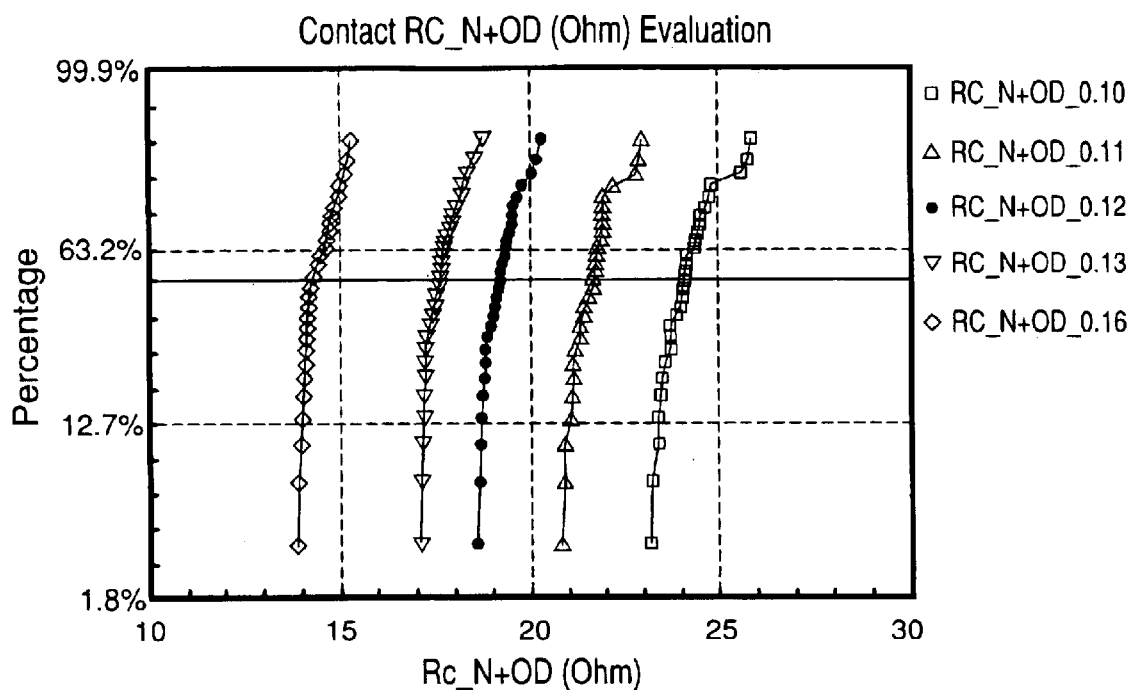
FIGS. 4A–4D are cumulative curves of measured contact resistance values of contact plug regions formed according to the present method.
Figure 4B:
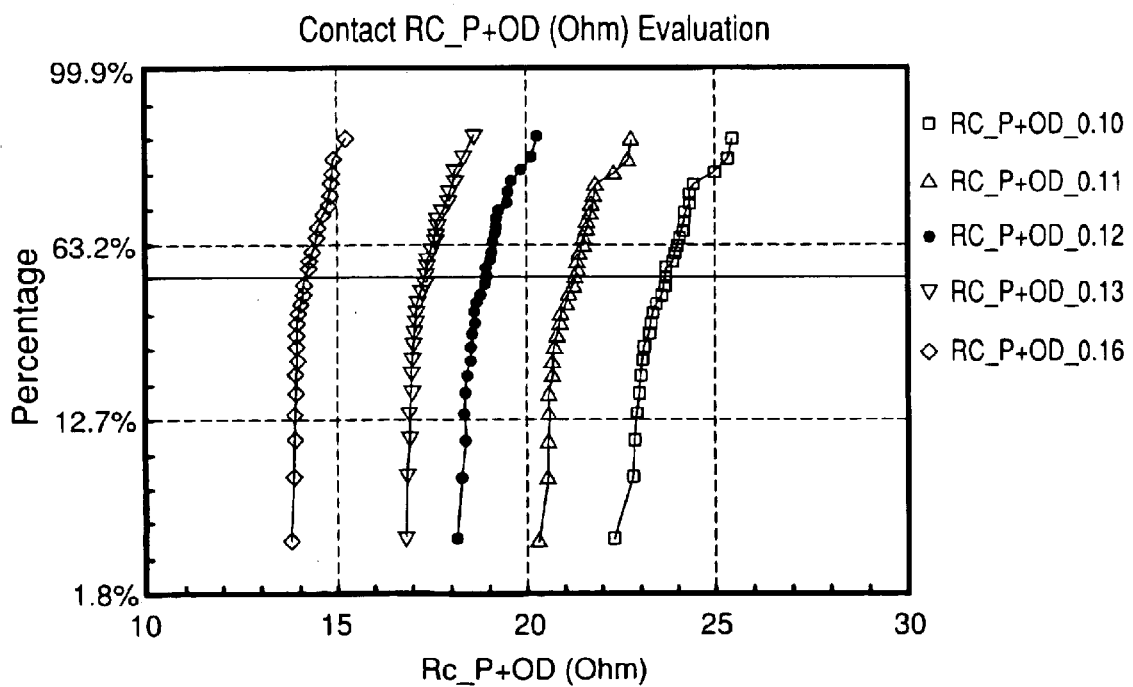
Figure 4C:
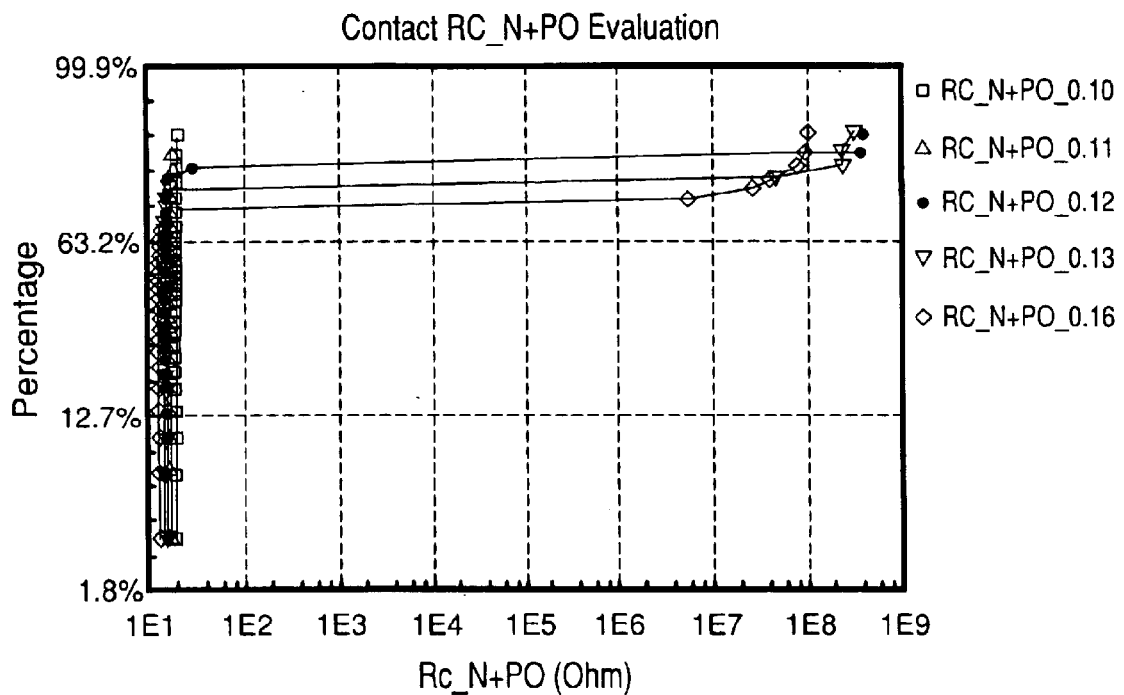
Figure 4D:
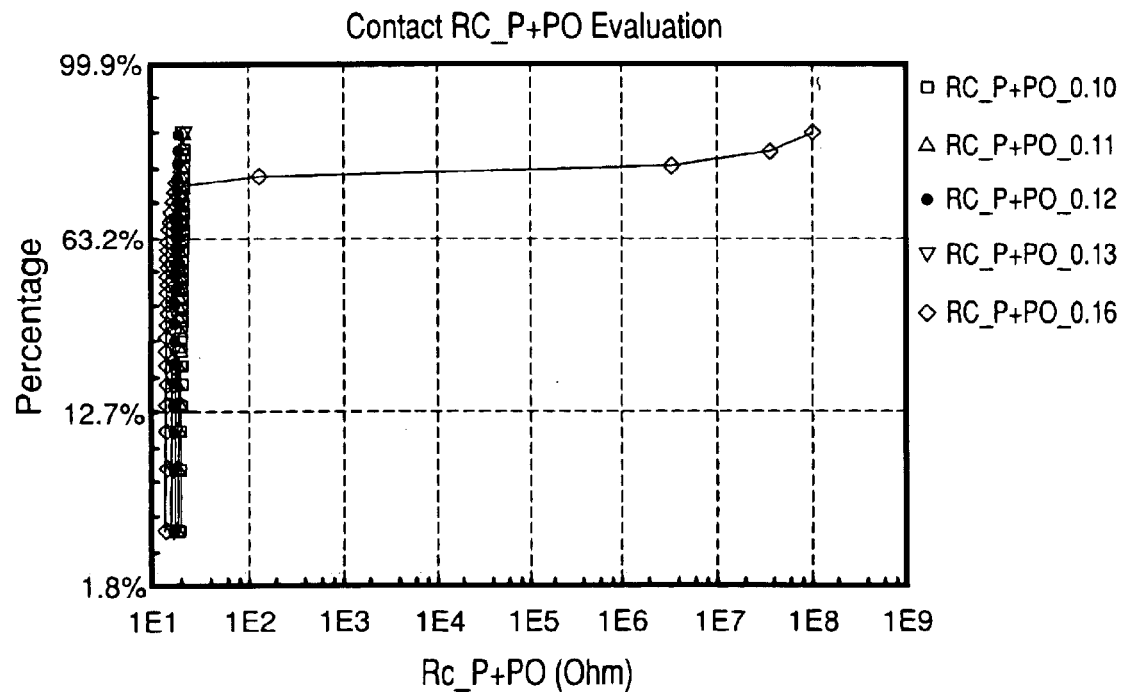

As mentioned, the method of forming contact plugs described above was tested. The contact resistance values of different dies were plotted together in cumulative curves. Specifically, the contact resistances were measured and plotted for contact plugs having diameters of 0.10, 0.11, 0.12, 0.13 and 0.16 μm for the following contact regions: contact to N+ active region (FIG. 4A) contact to P+ active region (FIG. 4B); contact to N+ polysilicon region (FIG. 4C); and contact to P+ polysilicon region (FIG. 4D).

The aforementioned cumulative curves show yields for the fabrication process for contact areas of various sizes. The X-axis shows contact resistance values. Conventional process techniques would result in all measured contacts being open (i.e., contact Rc failure) and cumulative curves could not be generated. FIGS. 4A and 4B indicate 100% yields, with no measured open circuits as is evident from the cumulative plots. FIGS. 4C and 4D exhibit vastly improved yield results over prior processes, with only a small percentage of the 0.12, 0.13 and 0.16 μm contact regions in FIG. 4C and 0.16 μm contact regions indicating open circuits.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A method of manufacturing a semiconductor device, comprising the steps of:
   (a) forming a semiconductor element on a substrate, said semiconductor element having at least one nickel silicide contact region, an etch stop layer formed over said element and an insulating layer formed over said etch stop layer;
   (b) removing a portion of said etch stop layer immediately over a selected contact region using a process that does not substantially react with said contact region, to form a contact opening, said process including a non-CF based removal process; and
   (c) filling said contact opening with conductive material to form a contact.

2. The method of claim 1, wherein step (b) includes the step of removing said insulating layer to form an opening over said selected contact region through said insulating layer at least to said etch stop layer without exposing said contact region.

3. The method of claim 2, wherein said insulating layer removal step includes the step of forming said opening partially through said etch stop layer.

4. The method of claim 3, wherein said etch stop layer has an initial thickness of between about 100–500 Å and a portion of the etch stop layer having a thickness of between about 50–200 Å is removed when said opening is formed partially through said etch stop layer.

5. The method of claim 1, wherein said portion of said etch stop layer is removed using a sputtering process utilizing an inert gas.

6. The method of claim 5, wherein said sputtering process is an argon sputter process or a helium sputter process.

7. The method of claim 1, wherein said portion of said etch stop layer is removed using a dry etch process utilizing an inert gas.

8. The method of claim 7, wherein said dry etch process is a plasma etch using a nitrogen fluoride and helium or argon mix.

9. The method of claim 8, wherein said mix is approximately 0.01–10% nitrogen fluoride.

10. The method of clam 7, wherein said dry etch process is a plasma etch using a hydrogen fluoride and helium or argon mix.

11. The method of claim 10, wherein said mix is approximately 0.01–10% hydrogen fluoride.

12. A method of manufacturing a semiconductor device, comprising the steps of:
   (a) forming a semiconductor element on a substrate, said semiconductor element having at least one nickel silicide contact region, a first etch stop layer formed over said element, a second etch stop layer formed over said first etch stop layer and an insulating layer formed over said second etch stop layer;
   (b) removing said first etch stop layer over a selected contact region using a process that does not substantially react with said contact region, to form a contact opening, said process including a non-CF based removal process; and
   (c) filling said contact opening with conductive material to form a contact.

13. The method of claim 12, wherein step (b) includes the step of forming an opening over said selected contact region to said first etch stop layer without exposing said selected contact region.

14. The method of claim 12, wherein said first etch stop layer is removed using a sputtering process utilizing an inert gas.

15. The method of claim 14, wherein said sputtering process is an argon or helium sputter process.

16. The method of claim 12, wherein said first etch stop layer is removed using a dry etch process utilizing an inert gas.

17. The method of claim 16, wherein said dry etch process is a plasma etch using a nitrogen fluoride and helium or argon mix.

18. The method of claim 17, wherein said mix is approximately 0.01–10% nitrogen fluoride.

19. The method of claim 16, wherein said dry etch process is a plasma etch using a hydrogen fluoride and helium or argon mix.

20. The method of claim 19, wherein said mix is approximately 0.01–10% hydrogen fluoride.

21. The method of claim 12, wherein said first etch stop layer is an oxide.

22. The method of claim 21, wherein said first etch stop layer has a thickness of less than or equal to approximately 100 Å.

23. A method of manufacturing a semiconductor device, comprising the steps of:
- (a) forming a semiconductor element on a substrate, said semiconductor element having at least one nickel silicide contact region, an etch stop layer formed over said element and an insulating layer formed over said etch stop layer;
- (b) etching an opening over a selected contact region through said insulating layer at least to said etch stop layer using a first process without exposing said selected contact region;
- (c) removing a portion of said etch stop layer immediately over said selected contact region using a second process that does not substantially react with said contact region, said second process including a non-CF based removal process, whereby a contact opening is formed; and
- (d) filling said contact opening with conductive material to form a contact.

24. The method of claim 23, wherein said etch stop layer has a thickness of between approximately 100–500 Å and between about 5 0–200 Å is removed at step (b).

25. The method of claim 23, wherein said second etch process is a sputtering process utilizing an inert gas.

26. The method of claim 25, wherein said sputtering process is an argon or helium sputter process.

27. The method of claim 23, wherein said second etch process is a dry etch process utilizing an inert gas.

28. The method of claim 27, wherein said dry etch process is a plasma etch using a nitrogen fluoride and helium or argon mix, wherein said mix is approximately 0.01–10% nitrogen fluoride.

29. The method of claim 27, wherein said dry etch process is a plasma etch using a hydrogen fluoride and helium or argon ink, wherein said mix is approximately 0.01–10% hydrogen fluoride.

30. The method of claim 23, wherein said etch stop layer includes silicon nitride or silicon oxy-nitride, and said first process includes a CF based dry etch process.

31. A method of manufacturing a semiconductor device, comprising the steps of:
- (a) forming a semiconductor element on a substrate, said semiconductor element having at least one metal silicide contact region, a first etch stop layer including an oxide formed over said element, a second etch stop layer formed over said first etch stop layer and an insulating layer formed over said second etch stop layer;
- (b) etching an opening over a selected contact region to said first etch stop layer using a first process without exposing said selected contact region;
- (c) removing said first etch stop layer over said selected contact region using a second process that does not substantially react with said contact region, said second process including a non-CF based removal process, whereby a contact opening is formed; and
- (d) filling said contact opening with conductive material to form a contact.

32. The method of claim 31, wherein said metal silicide contact region is a nickel silicide contact region.

33. The method of claim 32, wherein said second process is a sputtering process utilizing an inert gas.

34. The method of claim 33, wherein said sputtering process is an argon or helium sputter process.

35. The method of claim 32, wherein said second process a dry etch process utilizing an inert gas.

36. The method of claim 35, wherein said dry etch process is a plasma etch using a nitrogen fluoride and helium or argon mix, wherein said mix is approximately 0.01–10% nitrogen fluoride.

37. The method of claim 35, wherein said dry etch process is a plasma etch using a hydrogen fluoride and helium or argon mix, wherein said mix is approximately 0.01–10% hydrogen fluoride.

38. The method of claim 32, wherein said second etch stop layer includes silicon nitride or silicon oxy-nitride, and said first process includes a CF based dry etch process.

39. The method of claim 31, wherein said first etch stop layer has a thickness of less than or equal to approximately 100 Å.

40. A method of manufacturing a semiconductor device, comprising the steps of:
- (a) forming a semiconductor element on a substrate, said semiconductor element having at least one metal silicide contact region, an etch stop layer formed over said element and an insulating layer formed over said etch stop layer;
- (b) etching an opening over a selected contact region partially through said etch stop layer with a first process without exposing said selected contact region;
- (c) removing a portion of said etch stop layer immediately over said selected contact region using a second process that does not substantially react with said contact region, said second process including a non-CF based removal process, whereby a contact opening is formed; and
- (d) filling said contact opening with conductive material to form a contact.

41. The method of claim 40, wherein said second process is a sputtering process utilizing an inert gas.

42. The method of claim 40, wherein said, second process is a plasma etch using a nitrogen fluoride and helium or argon mix, wherein said mix is approximately 0.01–10% nitrogen fluoride.

43. The method of clam 40, wherein said second process is a plasma etch using a hydrogen fluoride and helium or argon mix, wherein said mix is approximately 001–10% hydrogen fluoride.

* * * * *

UNITED STATES PATENT AND TRADEMARK OFFICE
CERTIFICATE OF CORRECTION

PATENT NO.     : 6,884,736 B2
DATED          : April 26, 2005
INVENTOR(S)    : Chii-Ming Wu It is certified that error appears in the above-identified patent and that said Letters Patent is hereby corrected as shown below:

Column 7,
Line 30, delete "5 0-200" and insert -- 50-200 --.
Line 43, delete "ink" and insert -- mix --.

Column 8,
Line 50, delete "said," and insert -- said --.

Signed and Sealed this

Sixteenth Day of August, 2005

JON W. DUDAS
*Director of the United States Patent and Trademark Office*